(12) United States Patent
Sankur et al.

(10) Patent No.: US 8,138,078 B2
(45) Date of Patent: Mar. 20, 2012

(54) MECHANICALLY STABLE DIFFUSION BARRIER STACK AND METHOD FOR FABRICATING THE SAME

(75) Inventors: Haluk Sankur, Ventura, CA (US); Mason Thomas, Moorpark, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 876 days.

(21) Appl. No.: 12/176,162

(22) Filed: Jul. 18, 2008

(65) Prior Publication Data

US 2010/0013099 A1 Jan. 21, 2010

(51) Int. Cl.
*H01L 21/44* (2006.01)
(52) U.S. Cl. .................. 438/612; 257/E23.141
(58) Field of Classification Search .......... 438/666, 438/669, 628, 644, 652, 654, 612; 257/E23.141
See application file for complete search history.

(56) References Cited

U.S. PATENT DOCUMENTS 5,858,873 A * 1/1999 Vitkavage et al. ............ 438/626
* cited by examiner

*Primary Examiner* — Jenny L Wagner
(74) *Attorney, Agent, or Firm* — Koppel, Patrick, Heybl & Philpott

(57) ABSTRACT

A mechanically stable diffusion barrier stack structure and method of fabricating the same is disclosed. The diffusion barrier stack structure having a molybdenum nitride layer deposited on a molybdenum layer and operates to prevent diffusion between a semiconductor layer and a metal interconnect. The method for fabricating includes depositing a molybdenum layer outwardly from the semiconductor layer in a deposition chamber, and depositing a molybdenum nitride layer outwardly from the molybdenum layer in the deposition chamber.

6 Claims, 4 Drawing Sheets

MECHANICALLY STABLE DIFFUSION BARRIER STACK AND METHOD FOR FABRICATING THE SAME

BACKGROUND

This disclosure relates, generally, to a diffusion barrier for a semiconductor device and more specifically to a mechanically stable diffusion barrier stack and method for fabricating the same.

SUMMARY

A mechanically stable diffusion barrier and method of fabricating the same is disclosed. In one embodiment, the diffusion barrier includes a barrier stack structure having a molybdenum nitride layer deposited on a molybdenum layer and operates to prevent diffusion between a semiconductor layer and a metal interconnect. The barrier stack structure deposited outwardly from a semiconductor layer. A metal interconnect deposited outwardly from the barrier stack structure. A metal contact may be deposited outwardly from the semiconductor layer and separated from the metal interconnect via the barrier stack structure.

In one embodiment, the method for fabricating the mechanically stable diffusion barrier includes depositing a molybdenum layer outwardly from the semiconductor layer in a deposition chamber, and depositing a molybdenum nitride layer outwardly from the molybdenum layer in the deposition chamber.

DRAWINGS

Figure 1:
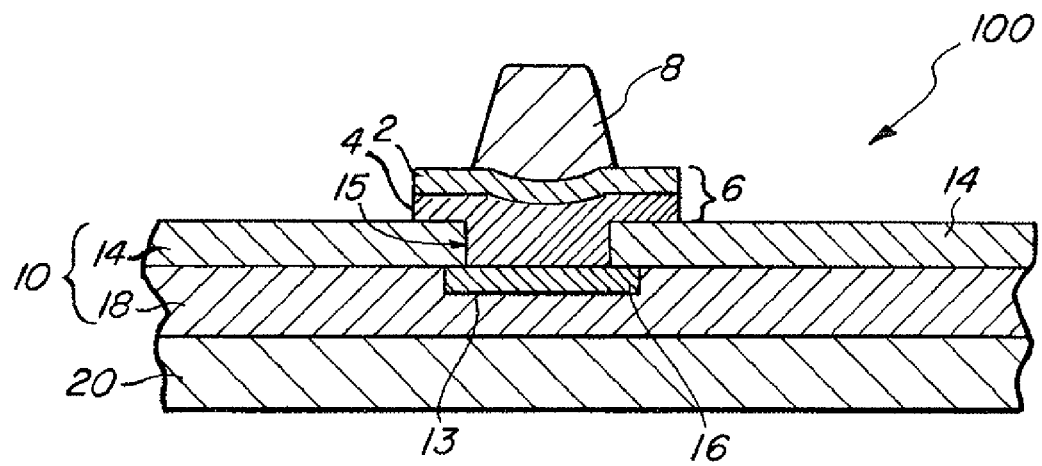
FIG. 1 is a cross-sectional view of a semiconductor device with a mechanically stable diffusion barrier, according to one embodiment of the present disclosure.

While the specification concludes with claims defining the features of the present disclosure that are regarded as novel, it is believed that the present disclosure's teachings will be better understood from a consideration of the following description in conjunction with the drawing figures, in which like reference numerals are carried forward.

DETAILED DESCRIPTION

In the description that follows, the present disclosure will be described in reference to a preferred embodiment that provides a mechanically stable diffusion barrier for a semiconductor device. The present disclosure, however, is not limited to any particular application nor is it limited by the examples described herein. Therefore, the description of the embodiments that follow are for purposes of illustration and not limitation.

Metal contacts or metal interconnects in a semiconductor device generally interdiffuse at low temperatures, causing degradation of the semiconductor device. While diffusion barriers are used to prevent interdiffusion of metal interconnect in the semiconductor device, the grain boundaries in their crystalline structures allow cracking to develop and diffusion to occur. For example, molybdenum (Mo) is a dense material that has large grains with boundaries that allow materials from propagating or diffusing through it. It is difficult to control the size of the grains in molybdenum, and hence the diffusion barrier characteristics are difficult to consistently reproduce.

Molybdenum nitride (MoN) may also be used as a diffusion barrier. Molybdenum nitride has a more controllable and finer grain structure than molybdenum. With a finer and smaller grain structure, the propagation or diffusion of metal interconnect through molybdenum nitride is reduced. However, molybdenum nitride is brittle, mechanically unstable and can generate large cracks through which diffusion can then easily occur.

The present disclosure is directed to a barrier stack structure with improved mechanical stability and reduced interdiffusion. FIG. 1 illustrates a cross-sectional view of a semiconductor device 100 with a mechanically stable diffusion barrier 6, according to one embodiment of the present disclosure. In one embodiment, the semiconductor device 100 may be utilized in an image sensor with an array of sensing elements or photodiodes coupled to a readout circuit by a metal interconnect 8 between individual array elements and their associated readout circuit. In one embodiment, the semiconductor device 100 may include a barrier stack structure 6, a metal interconnect 8, and a semiconductor layer 10.

The semiconductor layer 10 may be deposited on a substrate 20. The semiconductor layer 10 may include a passivating layer 14, a p-type layer 16, and an n-type layer 18. The n-type base 18 and p-type layer 16 may be fabricated from mercury cadmium telluride (HgCdTe) and respectively n-doped for the n-type base 18 and p-doped for the p-type layer 16. The passivating layer 14 may be cadmium telluride (CdTe), but can be any suitable wide band gap material.

The barrier stack structure 6 may be deposited outwardly from the semiconductor layer 10. The barrier stack structure 6 may include a molybdenum nitride (MoN) layer 2 and a molybdenum (Mo) layer 4. The molybdenum (Mo) layer 4 may be deposited outwardly from the semiconductor layer 10. In one embodiment, the passivating layer 14 of the semiconductor layer 10 may have an opening 15 for allowing the molybdenum (Mo) layer 4 to contact the p-type layer 16. The molybdenum nitride (MoN) layer 2 may be deposited outwardly from the molybdenum (Mo) layer 4.

The molybdenum layer 4 and the molybdenum nitride layer 2 can be deposited by chemical or physical deposition techniques in a deposition chamber or a plasma deposition chamber, known to a person skilled in the art. For example, a sputtering process may be used to introduce a gas in a vacuum to generate a highly reactive plasma that bombards and builds up molybdenum on the semiconductor layer 10. Nitrogen gas may then be introduced into the deposition chamber to deposit molybdenum nitride (MoN) layer 2 outwardly from the molybdenum layer 4. Subsequent to the deposition of molybdenum layer 4, the molybdenum nitride layer 2 or both, the molybdenum layer 4 and/or the molybdenum nitride layer 2 may then be patterned using lithographic techniques known to a person skilled in the art.

The metal interconnect 8 may be deposited outwardly from the barrier stack structure 6. In one embodiment, the metal interconnect 8 may be made of indium (In). The barrier stack structure 6 operates to prevent diffusion and reaction between the semiconductor layer 10 and the metal interconnect 8.

Figure 2:
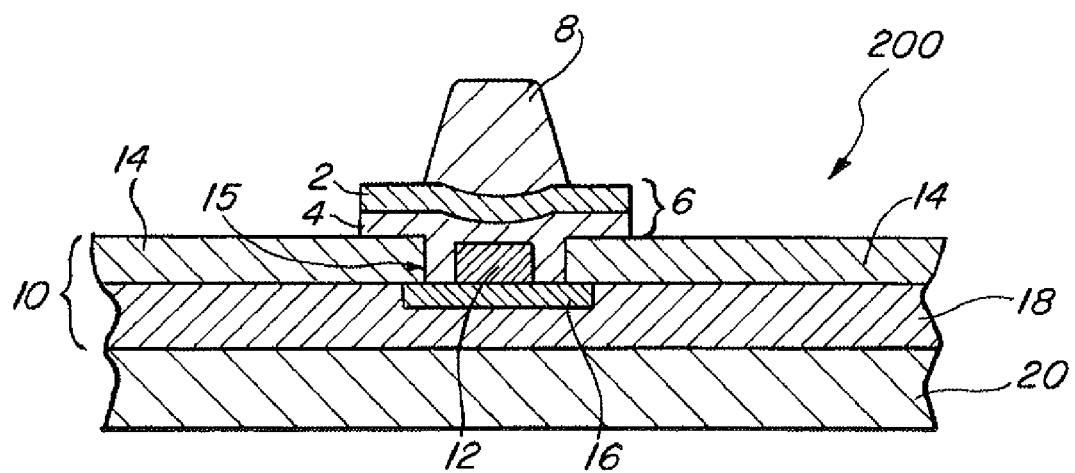
FIG. 2 is a cross-sectional view of a semiconductor device with a mechanically stable diffusion barrier and a metal contact, according to one embodiment of the present disclosure.

According to an embodiment of the present disclosure, a metal contact 12, as shown in FIG. 2, may be deposited outwardly from the semiconductor layer 10 prior to depositing the barrier stack structure 6. The metal contact 12 may be separated from the metal interconnect 8 via the barrier stack structure 6. In one embodiment, the metal contact 12 may be made of gold (Au) and deposited by deposition techniques well known to a person skilled in the art.

When the metal interconnect 8 diffuses to the semiconductor layer 10, it reacts with HgCdTe and causes defects in the HgCdTe semiconductor layer 10. These defects can cause leakage current to flow if the locations of the defects penetrate the p-n junction 13. Additionally, where metal contact 12 is used, the defects provide a path for the metal interconnect 8 and the metal contact 12 to diffuse into the p-n junction 13, resulting in a short across the p-n junction 13. Indium and gold tend to react and thus cause the metal contact 12 to separate from the HgCdTe p-type layer 16.

The barrier stack structure 10 of the present invention has been found to provide improved mechanical stability and reduced interdiffusion. By first depositing a molybdenum layer 4, which is relatively pliable and mechanically stable, and subsequently depositing a molybdenum nitride layer 2, which naturally fuses to the molybdenum layer, the barrier stack structure 6 does not crack, delaminate or debond. Thus, the molybdenum layer 4 adds to the mechanical stability of the molybdenum nitride layer 2 and the molybdenum nitride layer 2 adds to an increase in the prevention of diffusion.

Figure 3:
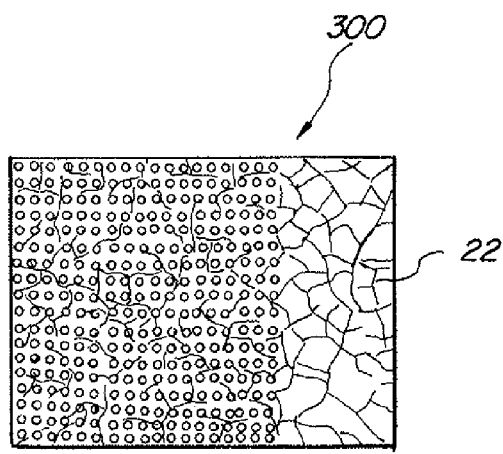
FIG. 3 is an exemplary microscope image of a prior art sensor array.
Figure 4:
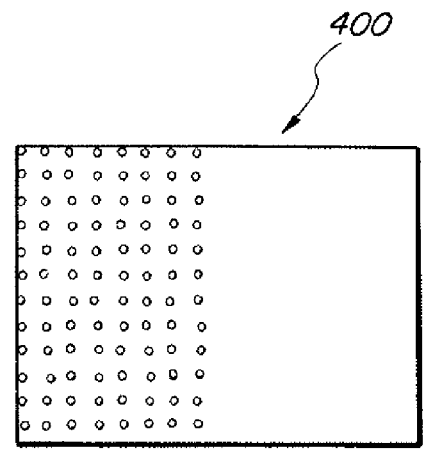
FIG. 4 is an exemplary microscope image of a sensor array with a barrier stack structure, according to one embodiment of the present disclosure.

FIG. 3 is an exemplary microscope image 300 of a prior art sensor array. FIG. 3 demonstrates the cracking 22 that can develop along grain boundaries. FIG. 4 is an exemplary microscope image 400 of a sensor array with barrier stack structure 6, according to one embodiment of the present disclosure. FIG. 4 demonstrates that the sensor does not crack, delaminate or debond due to the relative pliability and mechanically stability of the barrier stack structure 6.

Figure 5:
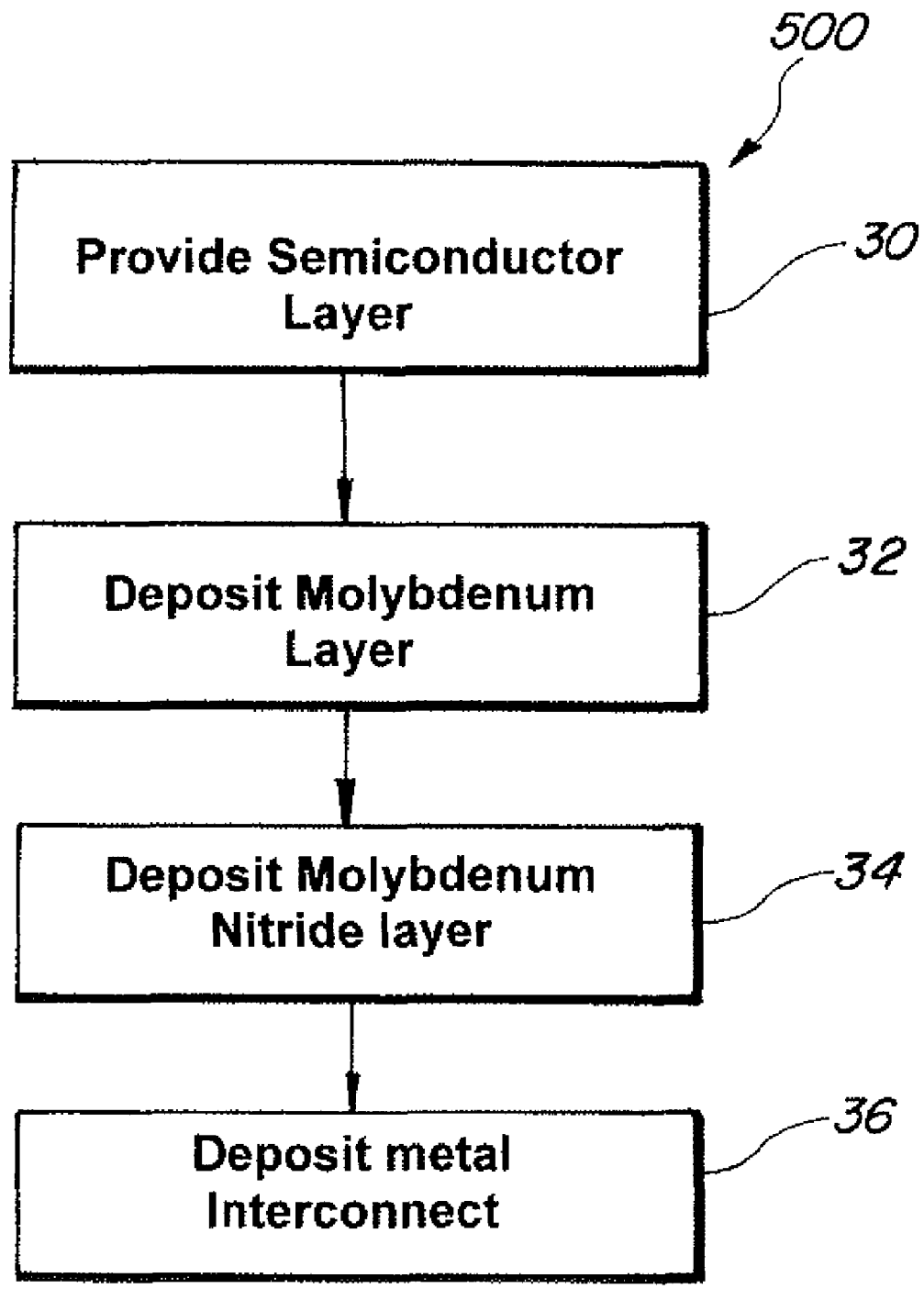
FIG. 5 is an exemplary flowchart illustrating the fabrication steps of a semiconductor device, according to one embodiment of the present disclosure.
Figure 6:
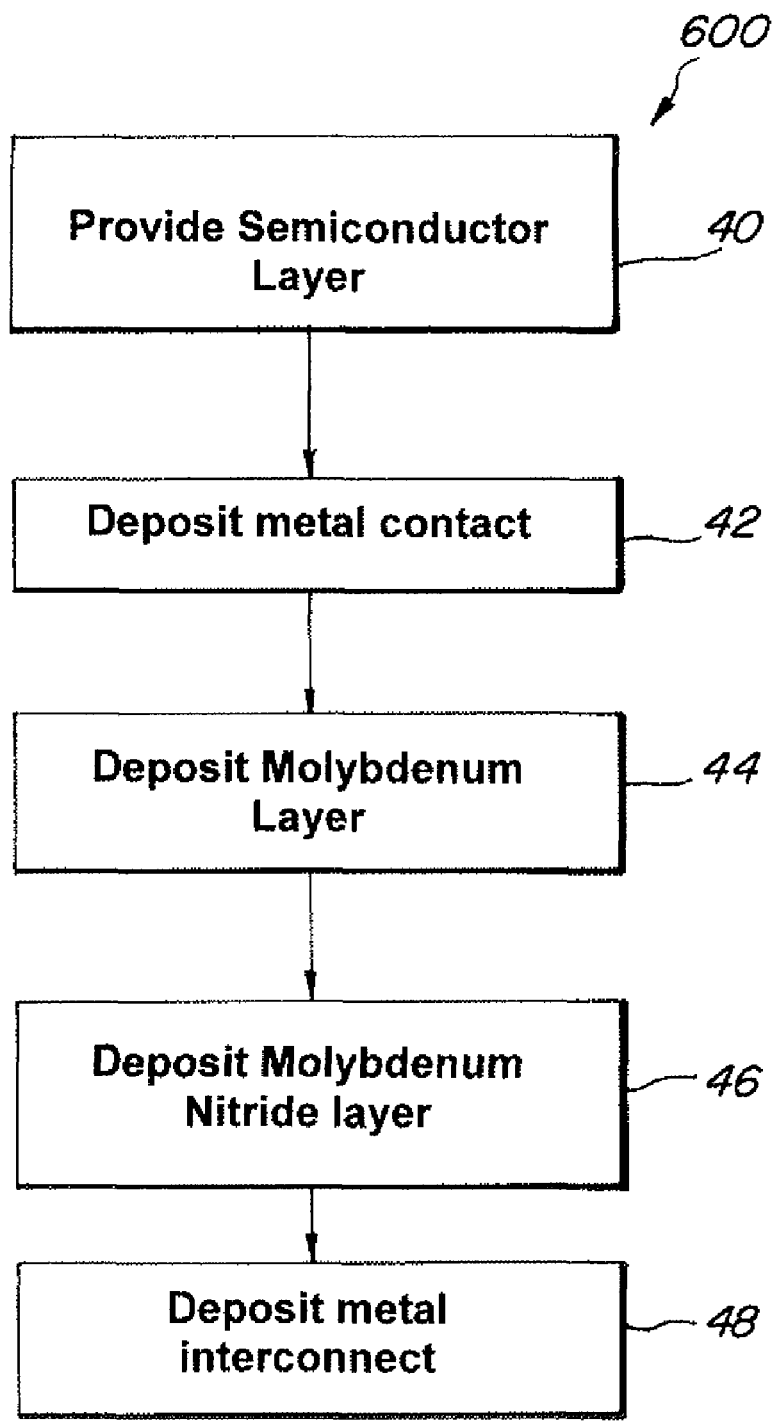
FIG. 6 is an exemplary flowchart illustrating the fabrication steps of a semiconductor device, according to one embodiment of the present disclosure.

Referring now to FIGS. 5-6, is a method for fabricating a mechanically stable diffusion barrier 6 between a semiconductor layer 10 and a metal interconnect 8 in a semiconductor device. In one embodiment, a process flow operation 500 for fabricating the mechanically stable diffusion barrier 6 is shown in FIG. 5. A semiconductor layer 10 with a p-n junction 13 and a passivating layer 14 may be provided (30). A molybdenum layer 4 is then deposited outwardly from the semiconductor layer 10 in a deposition chamber using, for example, a sputtering process (32). Next, molybdenum nitride layer 2 is deposited outwardly from the molybdenum layer 4 by introducing nitrogen in the deposition chamber (34). Subsequent operations may include patterning the molybdenum nitride layer 2 and/or the molybdenum layer 4. The patterning process may be carried out by photolithography or any other process that are well known to a person skilled in the art. A metal interconnect 8 is then deposited outwardly from the molybdenum nitride layer 2 (36).

In one embodiment, a process flow operation 600 for fabricating a mechanically stable diffusion barrier 6 is shown in FIG. 6. A semiconductor layer 10 with a p-n junction 13 and a passivating layer 14 may be provided (40). A metal contact 12 is then deposited outwardly from the semiconductor layer 10 (42). Next, a molybdenum layer 4 is deposited outwardly from the semiconductor layer 10 and the metal contact 12 in a deposition chamber using, for example, a sputtering process (44). Molybdenum nitride layer 2 is deposited outwardly from the molybdenum layer 4 by introducing nitrogen in the deposition chamber (46). Subsequent operations may include patterning the molybdenum nitride layer 2 and the molybdenum layer 4. The patterning process may be carried out by photolithography or any other process that is known to a person skilled in the art. A metal interconnect 8 is then deposited outwardly from the molybdenum nitride layer 2 (48).

While the diffusion barrier 6 and method for fabricating same have been described in terms of what are presently considered to be the most practical and preferred embodiments, it is to be understood that the disclosure need not be limited to the disclosed embodiments. For example, it is understood by a person skilled in the art that the barrier stack structure may comprise a molybdenum layer deposited outwardly from a molybdenum nitride layer. It should also be understood that a variety of changes may be made without departing from the essence of the invention. Such changes are also implicitly included in the description. They still fall within the scope of this disclosure. It should be understood that this disclosure is intended to yield a patent covering numerous aspects of the invention both independently and as an overall system and in both method and apparatus modes.

Further, each of the various elements of the invention and claims may also be achieved in a variety of manners. This disclosure should be understood to encompass each such variation, be it a variation of an embodiment of any apparatus embodiment, a method or process embodiment, or even merely a variation of any element of these. Particularly, it should be understood that as the disclosure relates to elements of the invention, the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled.

It should be understood that all actions may be expressed as a means for taking that action or as an element which causes that action. Similarly, each physical element disclosed should be understood to encompass a disclosure of the action which that physical element facilitates.

It should be understood that various modifications and similar arrangements are included within the spirit and scope of the claims, the scope of which should be accorded the broadest interpretation so as to encompass all such modifications and similar structures. The present disclosure includes any and all embodiments of the following claims.

The invention claimed is:

1. A method for fabricating a mechanically stable diffusion barrier between a semiconductor layer and a metal interconnect in a semiconductor device, the method comprising:
    depositing a molybdenum layer outwardly from the semiconductor layer in a deposition chamber;
    depositing a molybdenum nitride layer outwardly from the molybdenum layer in the deposition chamber;
    patterning the molybdenum layer;
    patterning the molybdenum nitride layer; and
    depositing a metal interconnect outwardly from the molybdenum nitride layer, said molybdenum nitride layer providing a diffusion barrier between said metal interconnect and said semiconductor layer;
    such that said molybdenum layer fuses to said molybdenum nitride layer and serves to improve the mechanical stability of said molybdenum nitride layer and thereby improve said molybdenum nitride layer's performance as a diffusion barrier between said metal interconnect and said semiconductor layer.

2. The method of claim 1, further comprising depositing a metal contact outwardly from the semiconductor layer prior to the step of depositing a molybdenum layer, wherein the molybdenum layer is deposited outwardly from the metal contact.

3. The method of claim 1, wherein the semiconductor layer is a passivating layer.

4. The method of claim 1, wherein the metal interconnect is indium.

5. The method of claim 1, wherein the deposition chamber is a plasma deposition chamber.

6. A method for fabricating a mechanically stable diffusion barrier between a semiconductor layer and a metal interconnect in a semiconductor device, the method comprising:
   providing a substrate;
   providing a p-type layer;
   providing an n-type layer, such that said p-type and n-type layers form a p-n junction;
   depositing a passivating layer over said p-type and n-type layers;
   processing said passivating layer so as to provide an opening to one of said p-type or n-type layers;
   depositing a molybdenum layer on said passivating layer and in said opening;
   depositing a molybdenum nitride layer on said molybdenum layer;
   patterning the molybdenum layer;
   patterning the molybdenum nitride layer; and
   depositing a metal interconnect on said molybdenum nitride layer, said molybdenum nitride layer providing a diffusion barrier between said metal interconnect and said p-type and n-type layers;
   such that said molybdenum layer fuses to said molybdenum nitride layer and serves to improve the mechanical stability of said molybdenum nitride layer and thereby improve said molybdenum nitride layer's performance as a diffusion barrier between said metal interconnect and said p-type and n-type layers.

* * * * *